US012564087B2

(12) United States Patent
Koo et al.

(10) Patent No.: US 12,564,087 B2
(45) Date of Patent: Feb. 24, 2026

(54) METHOD FOR MAKING SEMICONDUCTOR DEVICE WITH DOUBLE SIDE MOLDING

(71) Applicant: STATS ChipPAC Pte. Ltd., Singapore (SG)

(72) Inventors: KyoWang Koo, Incheon (KR); SeoJun Bae, Gyeonggi-do (KR); JungSub Lee, Chungcheongnam-do (KR)

( * ) Notice: Subject to any disclaimer, the term of this patent is extended or adjusted under 35 U.S.C. 154(b) by 410 days.

(21) Appl. No.: 18/184,670

(22) Filed: Mar. 16, 2023

(65) Prior Publication Data
US 2023/0326769 A1 Oct. 12, 2023

(30) Foreign Application Priority Data
Mar. 25, 2022 (CN) .......................... 202210305657.3

(51) Int. Cl.
H01L 21/56 (2006.01)
H01L 23/00 (2006.01)
(Continued)

(52) U.S. Cl.
CPC .......... H01L 21/565 (2013.01); H01L 21/566 (2013.01); H01L 23/3128 (2013.01); H01L 24/11 (2013.01); H01L 25/50 (2013.01); *H01L 2224/11001* (2013.01); *H01L 2224/11009* (2013.01)

(58) Field of Classification Search
CPC ... H01L 21/565; H01L 21/566; H01L 21/568; H01L 2224/11001; H01L 2224/11019; H01L 2224/11009; B29C 43/00; B29C 43/02; B29C 43/18; B29C 2043/181; B29C 2043/182
See application file for complete search history.

(56) References Cited

U.S. PATENT DOCUMENTS 9,412,717 B2 8/2016 Chen et al.
9,679,783 B2 6/2017 Lin et al.
(Continued)

FOREIGN PATENT DOCUMENTS

JP 2017087551 A * 5/2017 ............. B29C 43/36
JP 2017092220 A * 5/2017 ......... H01L 23/3121
(Continued)

*Primary Examiner* — Ratisha Mehta
*Assistant Examiner* — Adam Joseph Mott
(74) *Attorney, Agent, or Firm* — .Junhe Law Office, P.C.; Yi Zhang

(57) ABSTRACT

A method for making a semiconductor device is provided. The method includes: providing a package including: a substrate including a top surface and a bottom surface; a top electronic component mounted on the top surface of the substrate; at least one conductive pillar formed on the bottom surface of the substrate; and a protection layer attached on the bottom surface of the substrate and covering the at least one conductive pillar; providing a molding apparatus including a top chase and a bottom chase, wherein a molding material is held in the bottom chase; attaching the protection layer onto the top chase of the molding apparatus; and moving the top chase and the bottom chase close to each other to compress the molding material to cover the top electronic component on the top surface of the substrate, thereby forming a top encapsulation on the top surface of the substrate.

10 Claims, 10 Drawing Sheets

(51) Int. Cl.
  *H01L 23/31*       (2006.01)
  *H01L 25/00*       (2006.01)

(56)         References Cited

U.S. PATENT DOCUMENTS

| | | | | |
|---|---|---|---|---|
| 11,056,461 | B2 | 7/2021 | Jang et al. | |
| 2007/0045793 | A1* | 3/2007 | Tanaka | H01L 21/7813 |
| | | | | 257/E21.601 |
| 2007/0164457 | A1* | 7/2007 | Yamaguchi | H01L 25/105 |
| | | | | 257/E25.023 |
| 2009/0011543 | A1* | 1/2009 | Karta | H01L 21/561 |
| | | | | 257/E23.116 |
| 2010/0213963 | A1* | 8/2010 | Yoshikawa | G01R 31/2896 |
| | | | | 324/762.02 |
| 2011/0278736 | A1* | 11/2011 | Lin | H01L 24/11 |
| | | | | 257/E21.507 |
| 2011/0298001 | A1* | 12/2011 | Akimoto | H10H 20/018 |
| | | | | 438/22 |
| 2013/0154108 | A1* | 6/2013 | Lin | H05K 1/185 |
| | | | | 257/774 |
| 2013/0337614 | A1 | 12/2013 | Fuergut et al. | |
| 2015/0279820 | A1* | 10/2015 | Usami | H01L 24/97 |
| | | | | 257/737 |
| 2016/0056055 | A1* | 2/2016 | Ko | H01L 25/50 |
| | | | | 438/126 |
| 2016/0086866 | A1* | 3/2016 | Choi | H01L 21/563 |
| | | | | 438/126 |
| 2016/0300813 | A1* | 10/2016 | Zhai | H01L 25/0652 |
| 2016/0343688 | A1* | 11/2016 | Bang | H01L 21/4857 |
| 2017/0338207 | A1* | 11/2017 | Chen | H01L 23/5385 |
| 2020/0035633 | A1* | 1/2020 | Mishra | H01L 24/11 |

FOREIGN PATENT DOCUMENTS

| | | | | | |
|---|---|---|---|---|---|
| JP | 2017092221 | A | * 5/2017 | ....... | H01L 21/67126 |
| JP | 2017188560 | A | * 10/2017 | ............ | H01L 21/56 |
| KR | 20180099336 | A | * 9/2018 | ............ | H01L 24/12 |
| TW | 201401466 | A | 1/2014 | | |
| TW | 202135243 | A | * 9/2021 | ........... | H01L 21/568 |

* cited by examiner

300

310 providing a package

320 attaching a protection layer on a bottom surface of a substrate of the package

330 loading the package into a molding apparatus to form a top encapsulation on a top surface of the substrate

340 removing the protection layer from the bottom surface of the substrate

METHOD FOR MAKING SEMICONDUCTOR DEVICE WITH DOUBLE SIDE MOLDING

TECHNICAL FIELD

The present application generally relates to semiconductor technology, and more particularly, to a method for making a semiconductor device.

BACKGROUND OF THE INVENTION

The semiconductor industry is constantly faced with complex integration challenges as consumers want their electronics to be smaller, faster and higher performance with more and more functionalities packed into a single device. One of the solutions is System-in-Package (SiP). SiP is a functional electronic system or sub-system that includes in a single package two or more heterogeneous semiconductor dice, such as a logic chip, a memory, integrated passive devices (IPD), RF filters, sensors, heat sinks, or antennas. Recently, SiP uses Double Side Molding (DSM) technology to further shrink the overall package size. However, semiconductor devices formed using the conventional DSM technology may have low reliability.

Therefore, a need exists for a more reliable double side molding process.

SUMMARY OF THE INVENTION

An objective of the present application is to provide a method for making a semiconductor device with higher reliability.

According to an aspect of embodiments of the present application, a method for making a semiconductor device is provided. The method may include: providing a package including: a substrate including a top surface and a bottom surface; a top electronic component mounted on the top surface of the substrate; at least one conductive pillar formed on the bottom surface of the substrate; and a protection layer attached on the bottom surface of the substrate and covering the conductive pillar; providing a molding apparatus including a top chase and a bottom chase, wherein a molding material is held in the bottom chase; attaching the protection layer onto the top chase of the molding apparatus; and moving the top chase and the bottom chase close to each other to compress the molding material to cover the top electronic component on the top surface of the substrate, thereby forming a top encapsulation on the top surface of the substrate.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
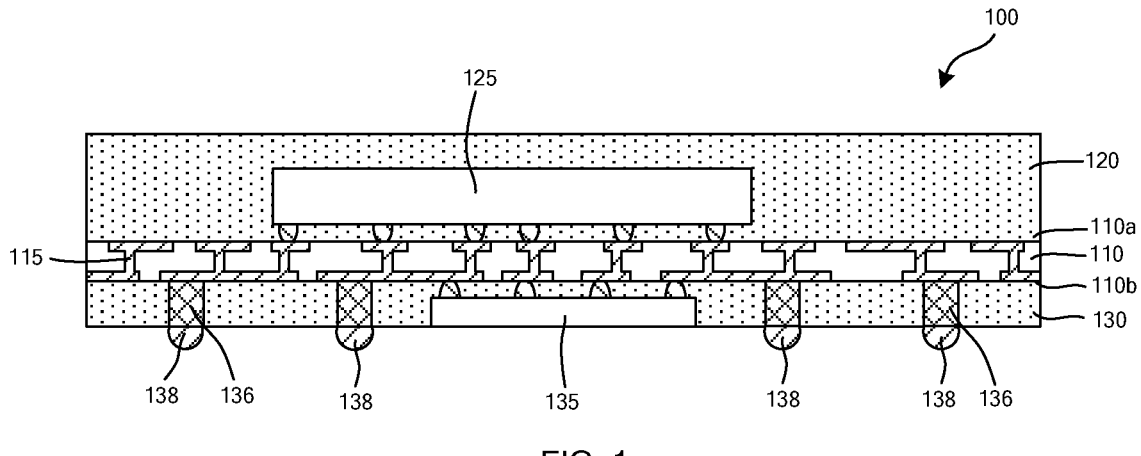
FIG. 1 is a cross-sectional view illustrating a semiconductor device formed using a double side molding technology.

FIG. 1 illustrates a cross-sectional view of a semiconductor device 100 formed using a Double Side Molding (DSM) technology.

As shown in FIG. 1, the semiconductor device 100 includes a substrate 110 with a top surface 110*a* and a bottom surface 110*b* which is opposite to the top surface 110*a*. The substrate 110 may include a redistribution structure (RDS) 115 having one or more dielectric layers and one or more conductive layers between and through the dielectric layers. A top electronic component 125 is mounted on the top surface 110*a* of the substrate 110, and a bottom electronic component 135 is mounted on the bottom surface 110*b*. A top encapsulant 120 is disposed on the top surface 110*a* and may cover the top electronic component 125 to protect against thermal shock, physical attach, fluid penetration, etc. Moreover, a bottom encapsulant 130 is disposed on the bottom surface 110*b* of the substrate 110 for similar protection purpose. One or more conductive pillars (for example, copper pillars) 136 may be formed on the bottom surface 110*b* of the substrate 110 and electrically connected to respective conductive patterns or other similar structures. A bump 138 is further formed onto each conductive pillar 136 to enable therethrough the connection of internal circuitry of the semiconductor device 100 with an exterior device or system.

In an example, in order to form the semiconductor device 100 of FIG. 1, the bottom electronic component 135 and the conductive pillars 136 are first formed on the bottom surface 110*b* of the substrate 110, and then the bottom encapsulant 130 is formed on the bottom surface 110*b* of the substrate 110 to protect the bottom electronic component 135 and the conductive pillars 136 from external environment. Afterwards, the top electronic component 125 is mounted on the top surface 110*a* of the substrate 110. However, the yield of mounting the top electronic component 125 may decrease by about 1%-3% due to high strip warpage caused by a molding process of the bottom encapsulant 130.

Figure 2:
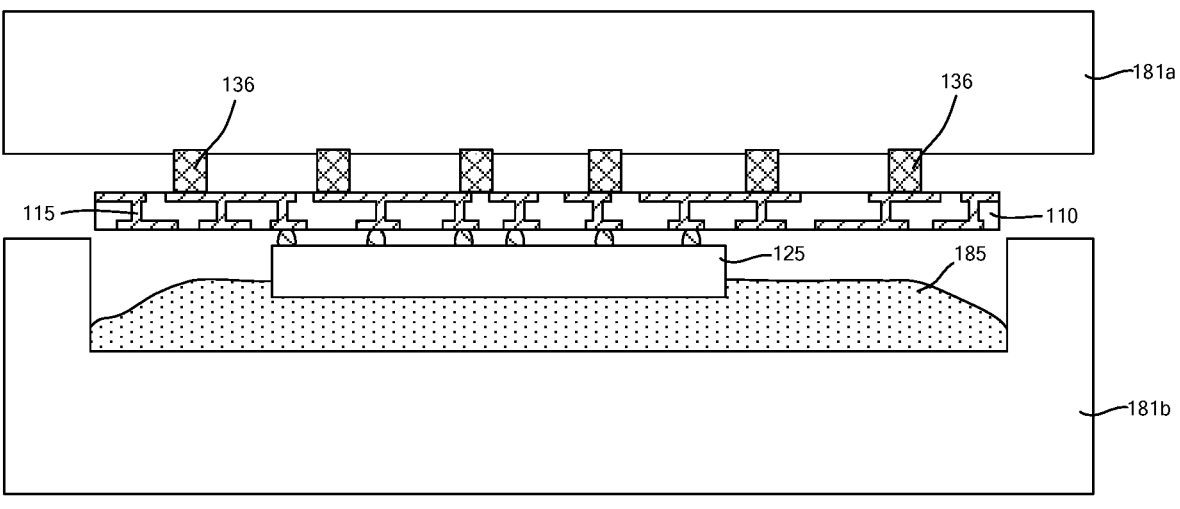
FIG. 2 illustrates a process for forming an encapsulation by a molding apparatus.

In another example, after the conductive pillars 136 are formed on the bottom surface 110*b* of the substrate 110, the top electronic component 125 is first mounted on the top surface 110*a* of the substrate 110, and then the substrate 110 is loaded into a molding apparatus to form the top encapsulant 120. FIG. 2 illustrates an exemplary molding process of the top encapsulant. As shown in FIG. 2, the substrate 110 is attached to a top chase 181*a* of a molding apparatus via the conductive pillars 136, and then the top chase 181*a* is moved towards a bottom chase 181*b* of the molding apparatus, with the substrate 110 clamped therebetween. A pressure may be applied onto the top chase 181*a* to compress a molding material accommodated in the bottom chase 181*b* to cover the top electronic component 125 of the substrate 110, so as to form the top encapsulation on the top surface of the substrate 110. As the conductive pillars 136 are in contact with the top chase 181*a* and may experience high pressure and temperature, the conductive pillars 136 are likely to be damaged during the molding process.

To address at least one of the above problems, a method for making a semiconductor device is provided in an aspect of the present application. In the method, a protection layer is attached onto the bottom surface of the substrate to cover the conductive pillars. Thus, when the substrate is loaded into a molding apparatus to form a top encapsulant thereon, the substrate is attached to a top chase of the molding apparatus via the protection layer. During the molding process, the protection layer can protect the conductive pillars from high pressure and temperature and thus avoid damages.

Figure 3:
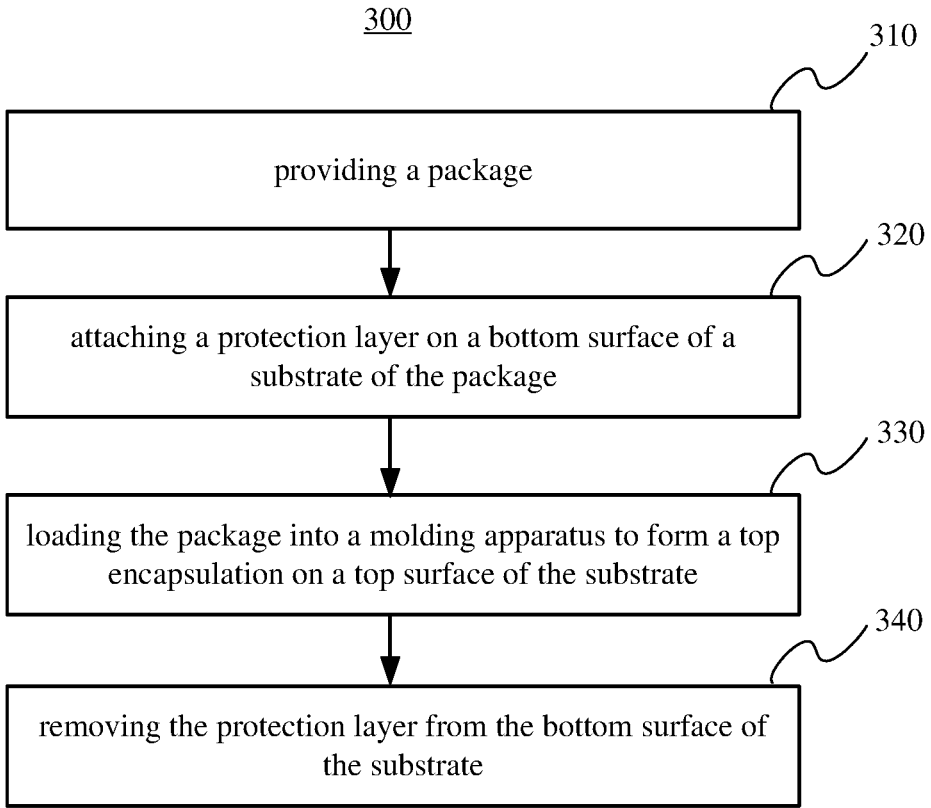
FIG. 3 is a flowchart illustrating a method for making a semiconductor device according to an embodiment of the present application.

Referring to FIG. 3, a flowchart of a method 300 for making a semiconductor device is illustrated according to an embodiment of the present application. As illustrated in FIG.

3, the method 300 may start with providing a package in block 310. The package may include a substrate and at least one conductive pillar formed on a bottom surface of the substrate. In block 320, a protection layer is attached onto the bottom surface of the substrate of the package. Then, in block 330, the package is loaded into a molding apparatus to form a top encapsulation on a top surface of the substrate. After the top encapsulation is formed, the protection layer is removed from the bottom surface of the substrate in block 340.

Referring to FIGS. 4A to 4L, cross-sectional views illustrating various blocks of the method for making a semiconductor device are illustrated. In the following, the method 300 of FIG. 3 will be described with reference to FIGS. 4A to 4L in more details.

Figure 4A:
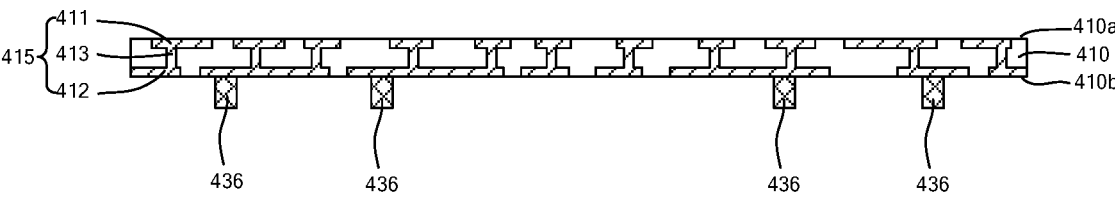
FIGS. 4A to 4L are cross-sectional views illustrating various steps of the method for making a semiconductor device illustrated in FIG. 3 according to an embodiment of the present application.

In particular, the process starts with providing a package substrate 410 as illustrated in FIG. 4A. The substrate 410 can be a laminate interposer, PCB, wafer-form, strip interposer, leadframe, or any other suitable substrate. The substrate 410 may include one or more insulating or passivation layers, one or more conductive vias formed through the insulating layers, and one or more conductive layers formed over or between the insulating layers. The substrate 410 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, and other reinforcement fibers or fabrics. The insulating layers may contain one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The substrate 410 can also be a multi-layer flexible laminate, ceramic, copper clad laminate, glass, or semiconductor wafer including an active surface containing one or more transistors, diodes, and other circuit elements to implement analog circuits or digital circuits. The substrate 410 may include one or more electrically conductive layers or redistribution layers (RDL) 415 formed using sputtering, electrolytic plating, electroless plating, or other suitable deposition process. The conductive layers may be one or more layers of Al, Cu, Sn, Ni, Au, Ag, titanium (Ti), tungsten (W), or other suitable electrically conductive material.

In the example shown in FIG. 4A, only one insulating layer is illustrated as a core substrate, a plurality of top conductive patterns 411 are formed on the top surface 410*a* of the substrate 410, and a plurality of bottom conductive patterns 412 are formed on the bottom surface 410*b* of the substrate 410. At least one of the plurality of top conductive patterns 411 and at least one of the plurality of bottom conductive patterns 412 are electrically connected respectively by a plurality of conductive vias 413 formed in the insulating layer. In some alternative embodiments, additional insulating layers and/or conductive layers may be formed over the structure shown in FIG. 4A to implement more advanced signal routing.

Still referring to FIG. 4A, a plurality of conductive pillars 436 are formed on the bottom surface 410*b* of the substrate 410. The conductive pillars 436 may include one or more of Al, Cu, Sn, Ni, Au, Ag, or other suitable electrically conductive material. In an example, each conductive pillar 436 is a copper pillar, but aspects of the present disclosure are not limited thereto. The conductive pillars 436 may be formed on the respectively bottom conductive patterns 412 on the bottom surface 410*b* of the substrate 410, and may be used for electrically connecting the redistribution structures in the substrate 410 with external devices. In an example, the conductive pillars 436 are formed by depositing (e.g., sputtering or plating) one or more layers of conductive material into openings of a mask layer. In other embodiments, conductive pillars 436 are formed using another suitable metal deposition technique or surface mounting technique.

It could be understood that the substrate 410 and the pillars 436 shown in FIG. 4A are only for illustrative purpose and not limiting. In some other embodiments, one or more electronic components (for example, active devices such as semiconductor dice, semiconductor packages, discrete transistors, discrete diodes, etc., or passive devices such as capacitors, inductors, or resistors, etc.) may be attached to the bottom surface 410b of the substrate 410. The one or more electronic components may have a smaller height than the pillars 436. In some cases, solder paste may be deposited or printed onto the bottom conductive patterns 412 on the bottom surface 410b of the substrate 410, and then the one or more electronic components may be attached to the bottom surface 410b of the substrate 410 via the solder paste. The one or more electronic components may be attached to the bottom surface 410b of the substrate 410 before or after forming the conductive pillars 436, or may be attached to the bottom surface 410b of the substrate 410 together with the conductive pillars 436, which is not limited in the present application.

Figure 4B:
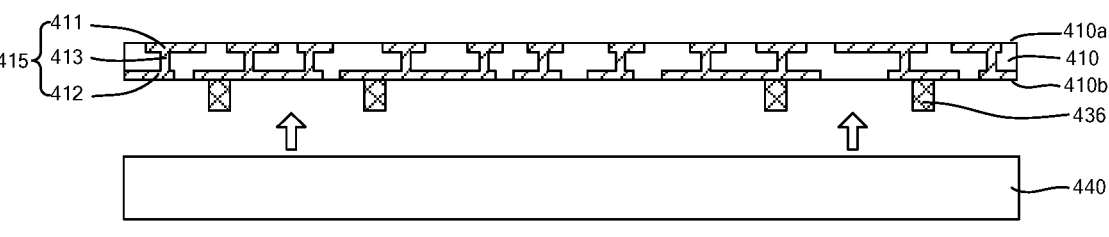

As illustrated in FIG. 4B, a protection layer 440 is attached to the bottom surface 410b of the substrate 410. In this example, the protection layer 440 includes one or more ultraviolet (UV) tape. The UV tape may be made of PVC, polyolefin, or polyethylene backing material with an adhesive for adhesion to a wafer or substrate. In some cases, the UV tape may have a release liner that will be removed prior to mounting the UV tape to the bottom surface 410b of the substrate 410. The thickness of the UV tape may range from 50 to 500 µm, for example, may be 100 µm, 200 µm, 300 µm or 400 µm. In a case where the thickness of the conductive pillars 436 are higher than that of a single layer of UV tape, more than one layers of UV tapes may be laminated to fully cover the conductive pillars 436, resulting a generally flat surface of the outmost UV tape. It can be understood that other types of tape may be used for protection purpose.

Figure 4C:
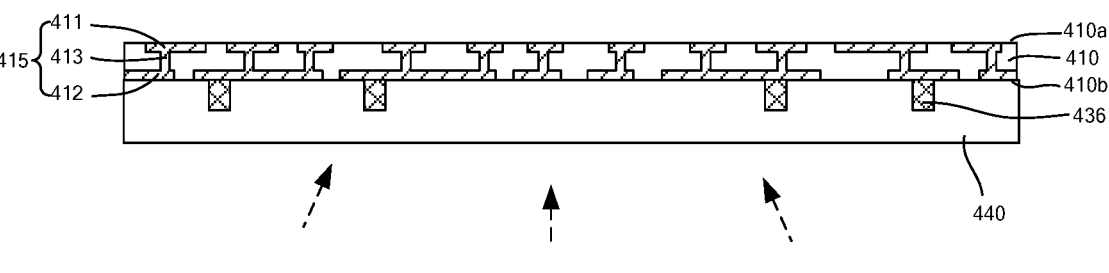

Afterwards, referring to FIG. 4C, the UV tapes are irradiated with UV light (as indicated by the dashed arrows in FIG. 4C). The adhesiveness of the UV tapes may be reduced, but the UV tapes can deform and further fill the gaps between the conductive pillars 436.

In other embodiments, the protection layer 440 may be a thermal release tape or other suitable material. The thermal release tape may be made of PET material, and its adhesiveness can be reduced when heat is applied to it.

Figure 4D:
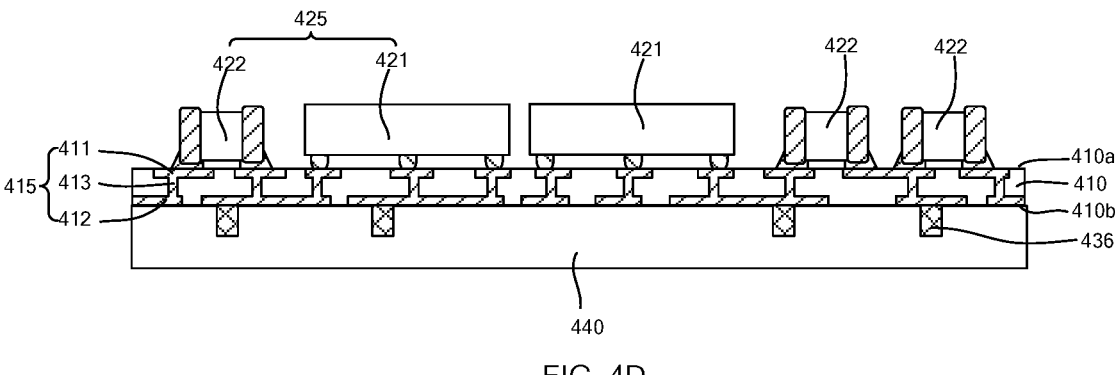

Referring to FIG. 4D, a top electronic component 425 may be mounted on the top surface 410a of the substrate 410. In some cases, solder paste may be deposited or printed onto the top conductive patterns 411 at locations where the top electronic component is to be surface mounted. The solder paste can be dispensed by jet printing, laser printing, pneumatically, by pin transfer, using a photoresist mask, by stencil-printing, or by another suitable process. Then, the top electronic component 425 may be mounted on the top surface 410a with terminals of the top electronic component 425 in contact with and over the solder paste. The solder paste may be reflowed to mechanically and electrically couple the top electronic component 425 to the top conductive patterns 411. The top electronic component 425 may include semiconductor dice 421 and discrete devices 422. The top electronic component 425 may be passive or active devices as desired to implement any given electrical functionality within the semiconductor package being formed. The top electronic component 425 may be active devices such as semiconductor dice, semiconductor packages, discrete transistors, discrete diodes, etc. The top electronic component 425 may also be passive devices such as capacitors, inductors, or resistors.

Figure 4E:
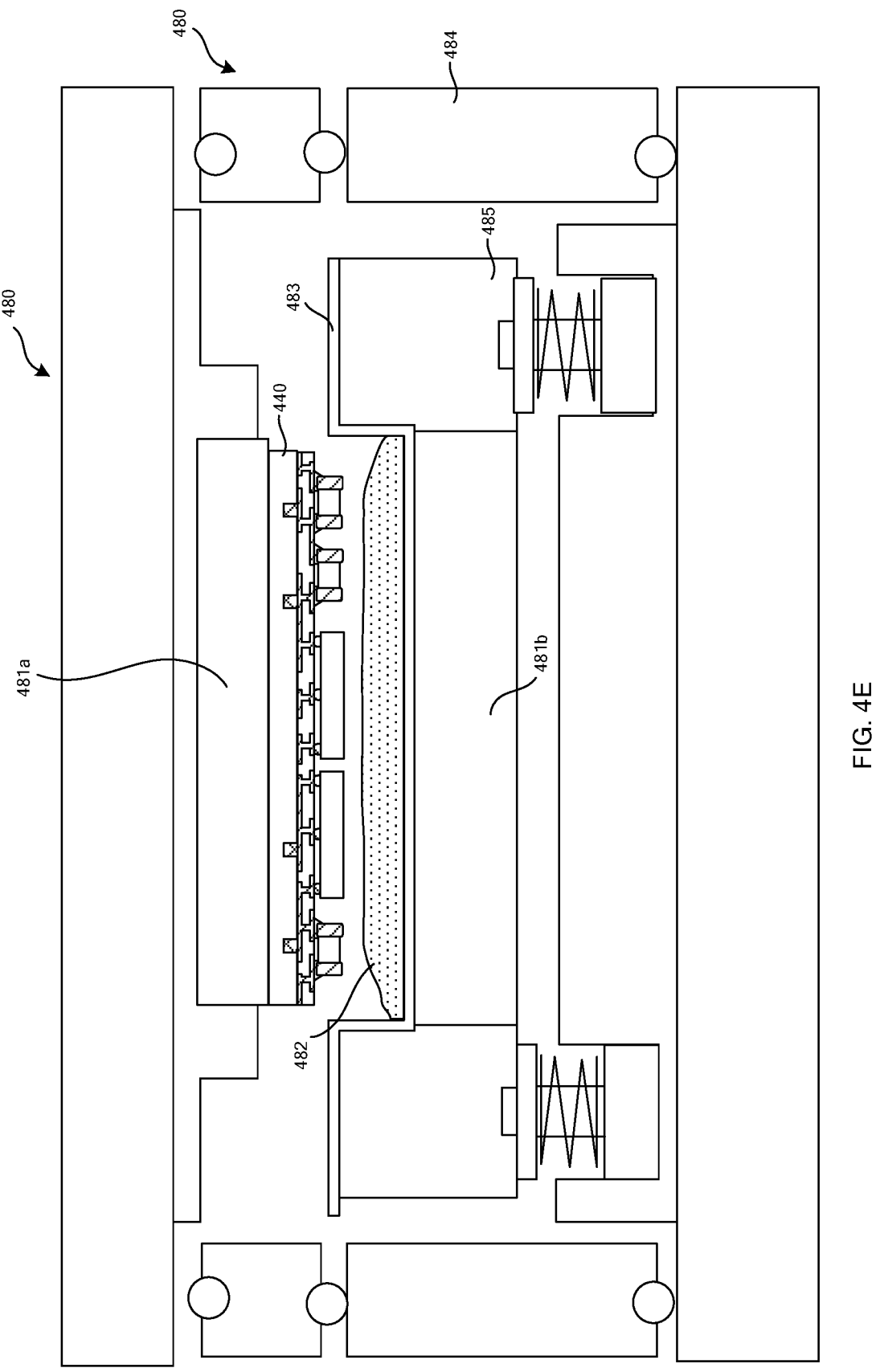

Referring to FIG. 4E, a molding apparatus 480 is provided. The molding apparatus 480 may normally be used for depositing a molding material over a package. The molding apparatus 480 may include a top chase 481a and a bottom chase 481b. The top chase 481a may be used to hold the package to be molded, and the bottom chase 481b may be used to hold the molding material 482. The molding material 482 may be a solid encapsulant, such as epoxy molding compound (EMC), polyimide, epoxy, and/or the like. The top chase 481a and the bottom chase 481b may define the geometry of the molding material 482 around the package. Pressure and heat may be applied to the molding material 482, and the top chase 481a and the bottom chase 481b may compress the heated molding material 482 into a required shape and/or geometry around the package. A release film 483 may be disposed between the bottom chase 481b and the molding material 482. The release film 483 may include a film with anti-stick property, which prevents any adhesion of the release film to the molding material 482 and vice versa. The release film 483 can enhance the molding process by ensuring the rapid and easy release of the finished molded devices.

The molding apparatus 480 also includes guiding components 484 and supporting components 485. The guiding components 484 may define the area where the top chase 481a may be placed during a molding process, and the supporting components 485 can provide an elastic support for the top chase 481a. In some cases, the molding apparatus 480 may further include (not shown in FIG. 4E) a moving control unit to move the top chase 481a downward, the bottom chase 481b upward, or both. It could be understood that the molding apparatus 480 shown in FIG. 4E are only for illustrative purpose and not limiting.

Still referring to FIG. 4E, the substrate 410 shown in FIG. 4D is loaded into the molding apparatus 480, and the protection layer 440 is attached to the top chase 481a of the molding apparatus 480. Then, the top chase 481a and the bottom chase 481b may be moved close to each other to compress the molding material 482, and a pressure and heating process may be applied to the molding material 482. The heating and pressure within the molding apparatus 480 may be sufficient to cure the molding material 482. The top chase 481a and the bottom chase 481b may compress the heated molding material (for example, liquid and/or uncured molding material) into the required shape and/or geometry around the top electronic component mounted on the top surface of the substrate until the molding material 482 is cured. After the molding material 482 is cured, the top chase 481a and the bottom chase 481b are separated from each other, and the substrate 410 is further removed from the molding apparatus 480 with the aid of the release film 483.

Figures 4F, 4G:
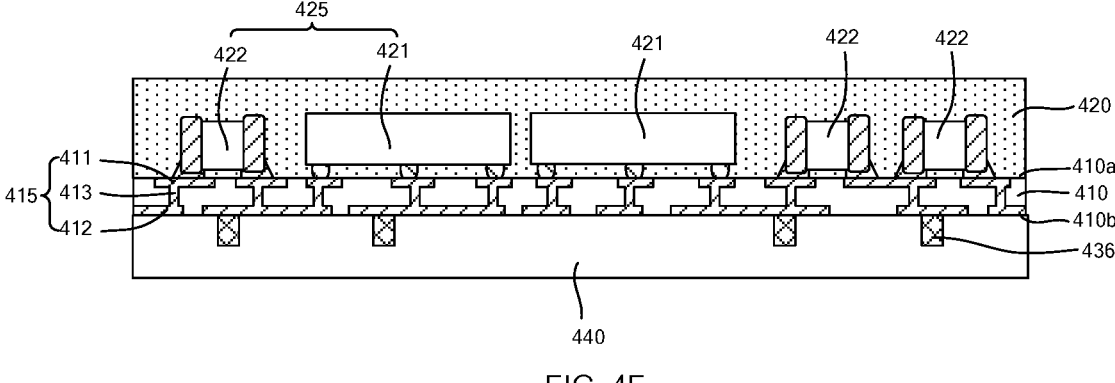

As shown in FIG. 4F, a top encapsulation 420 is formed on the top surface 410a of the substrate 410 after the substrate 410 is removed from the molding apparatus 480. The top encapsulant 420 may environmentally protect the top electronic component 425 from external elements and contaminants. Compared with the conventional method shown in FIG. 2, the protection layer 440 shown in FIGS. 4E and 4F can protect the conductive pillars 436 from high pressure and temperature during the molding process.

Afterwards, the protection layer 440 (i.e., the UV tapes) is removed from the bottom surface 410*b* of the substrate 410 as shown in FIG. 4G. As the UV tape has been irradiated with UV light, the adhesiveness of the UV tape is reduced, thereby facilitating its removal from the substrate 410. Further, the low adhesiveness also reduces wafer breakage during the removal process, and leaves the bottom surface 410*b* of the substrate 410 free of impurities, contamination, and any other residue.

Figure 4H:
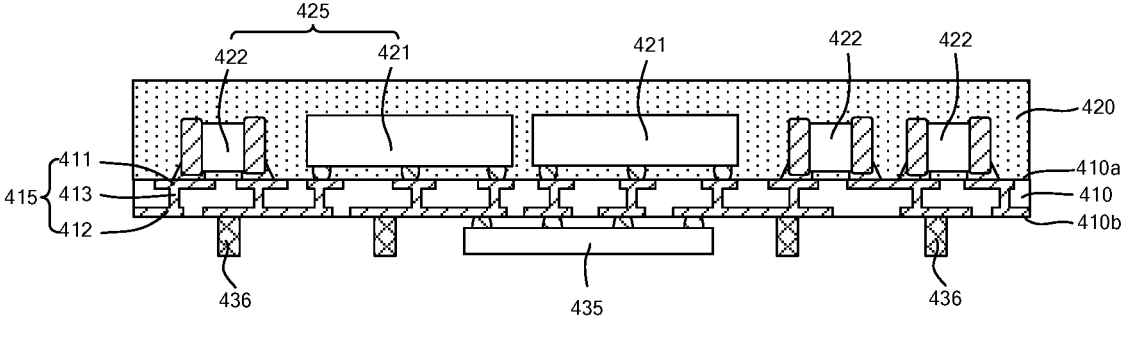

As shown in FIG. 4H, a bottom electronic component 435 is formed on the bottom surface 410*b* of the substrate 410. For example, the substrate 410 is flipped with the bottom surface 410*b* oriented upward. Solder paste is patterned onto parts of the bottom conductive patterns 412 on the bottom surface 410*b* of the substrate 410, and the bottom electronic component 435 is surface mounted on the bottom surface 410*b* through the solder paste. In the example of FIG. 4H, the bottom electronic component 435 is shown as a semiconductor die. In some other embodiments, a plurality of semiconductor dice or one or more discrete devices can be surface mounted on the bottom surface 410*b* through the solder paste.

Figure 4I:
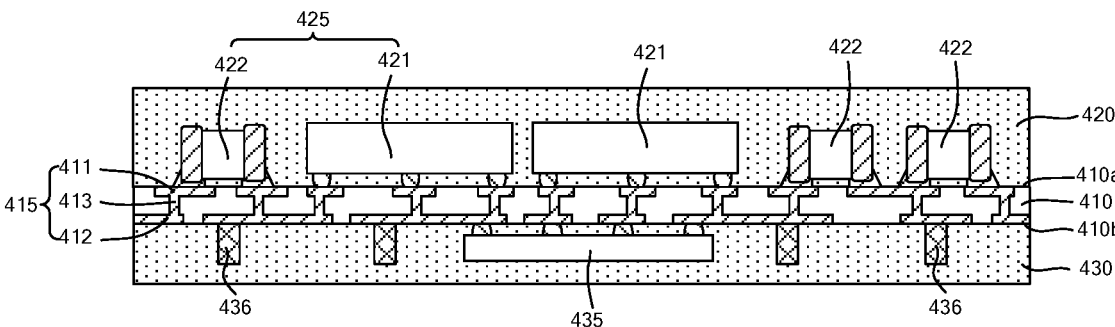

As shown in FIG. 4I, a bottom encapsulant 430 is formed on the bottom surface 410*b* of the substrate 410 to cover the bottom electronic component 435 and the conductive pillars 436. The bottom encapsulant 430 may be non-conductive and environmentally protect the bottom electronic component 435 and the conductive pillars 436 from external elements and contaminants. In some cases, the bottom encapsulant 430 may be formed using a process similar to the compression molding process forming the top encapsulant 420. In some cases, the bottom encapsulant 430 may be formed using a paste printing, transfer molding, liquid encapsulant molding, vacuum lamination, spin coating, or other suitable applicator. The bottom encapsulant 430 and the top encapsulant 420 may be made of the same material, for example, an epoxy-based resin. In some examples, the bottom encapsulant 430 may be planarized after being removed from the mold, if desired.

Figure 4J:
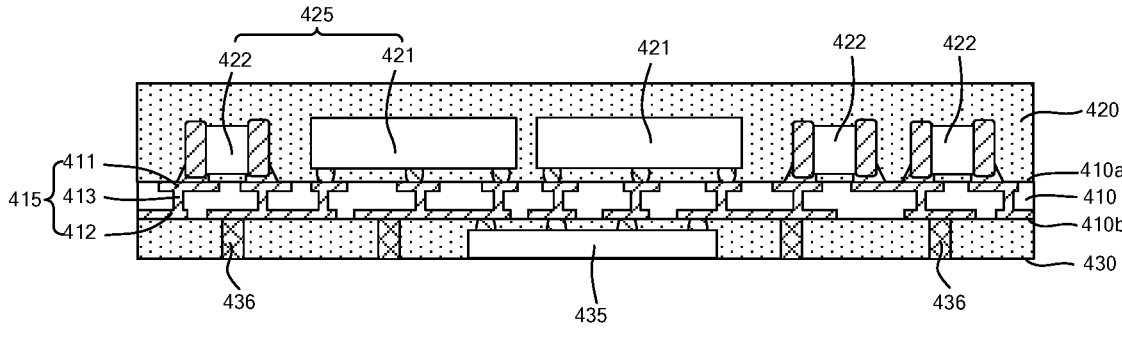

As shown in FIG. 4J, the bottom encapsulant 430 is planarized to expose the conductive pillars 436. In some embodiments, a backgrinding operation with grinder, or another suitable chemical or mechanical grinding or etching process, can be used to reduce a thickness of the bottom encapsulant 430 and expose the conductive pillars 436. The planarization may result in that a surface of the bottom encapsulant 430 is coplanar with a surface of the conductive pillars 436 by removing portions of the bottom encapsulant 430.

Figure 4K:
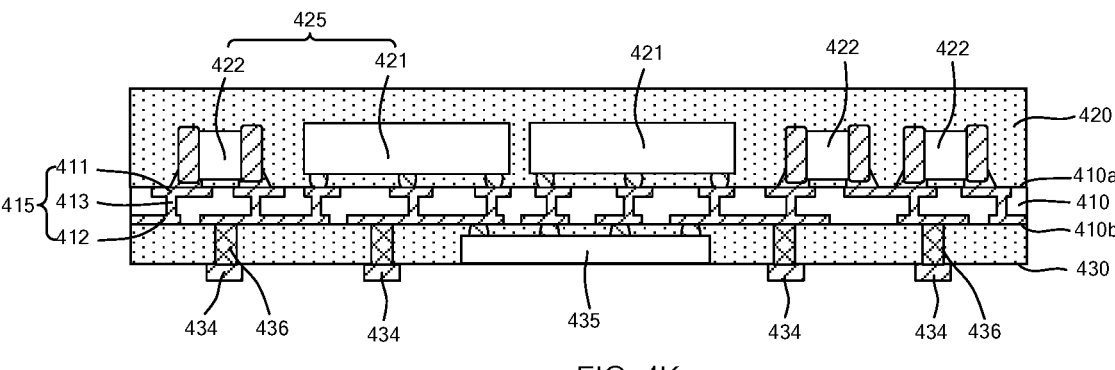

As shown in FIG. 4K, an electrically conductive bump material 434 may be deposited on each conductive pillar 436 using one of or any combination of the following processes: evaporation, electrolytic plating, electroless plating, ball drop, or screen printing process. The conductive bump material 434 may include Al, Sn, Ni, Au, Ag, lead (Pb), bismuth (Bi), Cu, solder, and combinations thereof, with an optional flux solution. For example, the conductive bump material 434 can be solder paste, and the solder paste is printed on the conductive pillars 436.

Figure 4L:
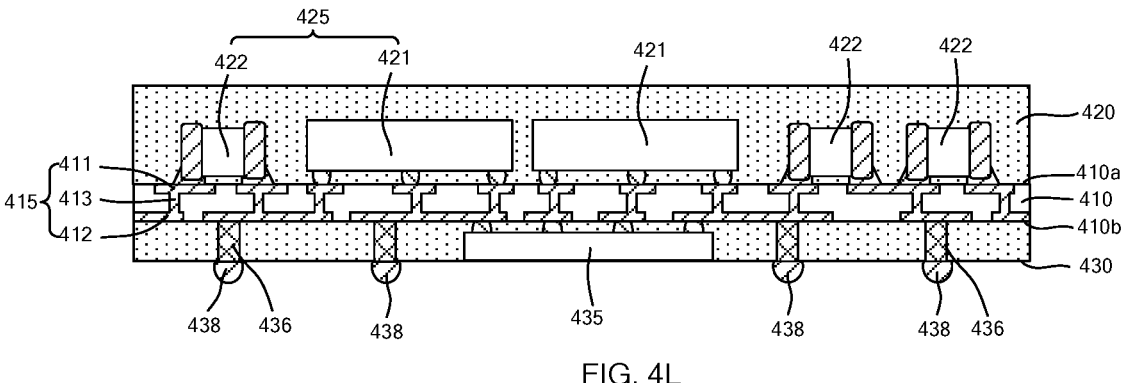

As shown in FIG. 4L, a bump 438 may be formed on each conductive pillar 436. For example, the bump material may be bonded to the conductive pillar 436 using a suitable attachment or bonding process. In an embodiment, the bump material may be reflowed by heating the material above its melting point to form the conductive ball or bump 438. The bump 438 may cover the exposed surface of the conductive pillar 436. The bump 438 may protrude from the bottom surface of the bottom encapsulant 430. In some applications, the bump 438 can also be compression bonded or thermocompression bonded to the conductive pillar 436. In a case that the conductive bump material includes flux solution, a deflux operation may be further performed to clean the flux solution. The hemispherical bump 438 shown in FIG. 4L may represent one type of interconnect structure that can be formed over the conductive pillar 436. In other examples, the bump 438 may be a stud bump, a micro bump, or other electrical interconnects.

In the embodiments shown in FIGS. 4A-4L, the conductive pillars are formed on the bottom surface of the substrate before forming the top encapsulation, while the bottom electronic component is mounted on the bottom surface of the substrate after forming the top encapsulation. In other embodiments, as illustrated in FIGS. 5A-5C, the conductive pillars and the bottom electronic component may both be formed before forming the top encapsulation.

Figure 5A:
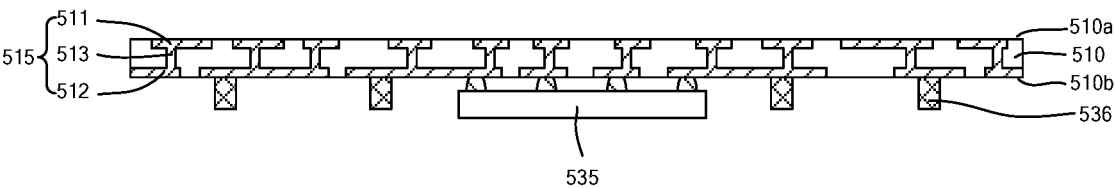
FIGS. 5A to 5C are cross-sectional views illustrating various steps of the method for making a semiconductor device illustrated in FIG. 3 according to another embodiment of the present application.

As shown in FIG. 5A, a package substrate 510 is provided. A plurality of top conductive patterns 511 are formed on the top surface 510*a* of the substrate 510, and a plurality of bottom conductive patterns 512 are formed on the bottom surface 510*b* of the substrate 510. At least one of the plurality of top conductive patterns 511 and at least one of the plurality of bottom conductive patterns 512 are electrically connected respectively by a plurality of conductive vias 513 formed in the insulating layer. A plurality of conductive pillars 536 are formed on the bottom surface 510*b* of the substrate 510. Moreover, a bottom electronic component 535 is formed on the bottom surface 510*b* of the substrate 510. For example, solder paste is patterned onto a portion of the bottom conductive patterns 512 on the bottom surface 510*b* of the substrate 510, and the bottom electronic component 535 is surface mounted on the bottom surface 510*b* through the solder paste.

Figure 5B:
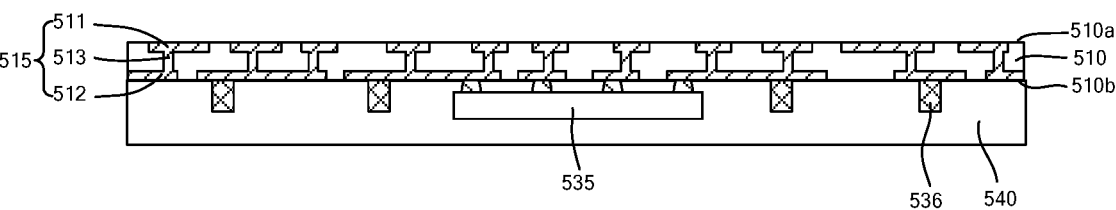

As shown in FIG. 5B, a protection layer 540 is attached onto the bottom surface 510*b* of the substrate 510. In some cases, the protection layer 540 may be laminated UV tapes, and the UV tapes may be irradiated with UV light.

Figure 5C:
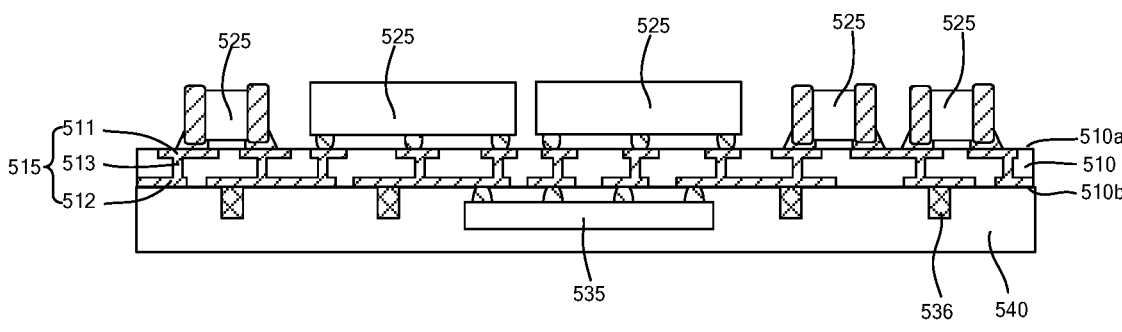

As shown in FIG. 5C, a top electronic component 525 may be mounted on the top surface 510*a* of the substrate 510. For example, solder paste may be deposited or printed onto the top conductive patterns 511 at locations where the top electronic component is to be surface mounted. Then, the top electronic component 525 may be mounted on the top surface 510*a* with terminals of the top electronic component 525 in contact with and over the solder paste. The solder paste may be reflowed to mechanically and electrically couple the top electronic component 525 to the top conductive patterns 511.

Afterward, the package shown in FIG. 5C may be loaded into a molding apparatus to form a top encapsulation on the top surface of the substrate, and the protection layer is removed from the top surface of the substrate after the top encapsulation is formed, which are similar to the processes shown in FIGS. 4E-4G, and will not be elaborated herein. Then, a bottom encapsulant is formed on the bottom surface of the substrate to cover the bottom electronic component and the conductive pillars. Afterwards, the bottom encapsulant is planarized to expose the conductive pillars, and bumps can be formed on the conductive pillars, respectively, which are similar to the processes shown in FIGS. 4I-4L and will not be elaborated herein.

While the process for making the semiconductor device is illustrated in conjunction with FIGS. 4A-4L and FIGS. 5A-5C, it will be appreciated by those skilled in the art that modifications and adaptations to the process may be made without departing from the scope of the present invention.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for making a semiconductor device, comprising:

providing a package comprising a substrate comprising a top surface and a bottom surface, a top electronic component mounted on the top surface of the substrate, at least one conductive pillar formed on the bottom surface of the substrate, and a protection layer attached onto the bottom surface of the substrate and covering the conductive pillar;

providing a molding apparatus comprising a top chase and a bottom chase, wherein a molding material is held in the bottom chase;

attaching the package onto the top chase of the molding apparatus via the protection layer; and moving the top chase and the bottom chase close to each other to compress the molding material to cover the top electronic component on the top surface of the substrate, thereby forming a top encapsulation on the top surface of the substrate.

2. The method of claim 1, wherein providing the package comprises:

providing the substrate;

forming the at least one conductive pillar on the bottom surface of the substrate;

forming the protection layer on the bottom surface of the substrate, the protection layer covering the at least one conductive pillar; and mounting the top electronic component on the top surface of the substrate.

3. The method of claim 2, wherein the protection layer comprises one or more ultraviolet (UV) tapes.

4. The method of claim 3, wherein forming the protection layer on the bottom surface comprises:

attaching the one or more UV tapes onto the bottom surface of the substrate, where the one or more UV tapes cover the at least one conductive pillar; and irradiating the one or more UV tapes with UV light.

5. The method of claim 1, further comprising:

separating the top chase and the bottom chase from each other;

removing the package from the molding apparatus; and removing the protection layer from the bottom surface of the substrate.

6. The method of claim 1, further comprising:

mounting a bottom electronic component on the bottom surface of the substrate.

7. The method of claim 6, further comprising:

forming a bottom encapsulation on the bottom surface of the substrate, wherein the bottom encapsulation covers the at least one conductive pillar and the bottom electronic component;

planarizing the bottom encapsulation to expose the at least one conductive pillar on the bottom surface of the substrate; and forming a bump on each conductive pillar.

8. The method of claim 7, wherein forming the bump on each conductive pillar comprises:

printing solder paste on the at least one conductive pillar of the bottom surface of the substrate; and reflowing the solder paste to form the bump.

9. The method of claim 1, wherein the molding apparatus further comprises a release film disposed on the bottom chase, and the molding material is held on the release film.

10. The method of claim 1, wherein the at least one conductive pillar comprises a copper pillar.

* * * * *